(12) United States Patent  
Lyders et al.

(10) Patent No.: US 8,816,711 B2
(45) Date of Patent: Aug. 26, 2014

(54) ELECTRICAL PROBE ASSEMBLY

(75) Inventors: David R. Lyders, Middletown, CT (US); George Alan Salisbury, East Hampton, CT (US)

(73) Assignee: United Technologies Corporation, Hartford, CT (US)

( * ) Notice: Subject to any disclaimer, the term of this patent is extended or adjusted under 35 U.S.C. 154(b) by 1370 days.

(21) Appl. No.: 12/547,561

(22) Filed: Aug. 26, 2009

(65) Prior Publication Data

US 2011/0047789 A1 Mar. 3, 2011

(51) Int. Cl.
*G01R 1/067* (2006.01)
*H01Q 1/36* (2006.01)
*H01J 49/40* (2006.01)
*H05K 1/11* (2006.01)
*H01R 24/58* (2011.01)
*H01R 107/00* (2006.01)
*H05K 1/14* (2006.01)

(52) U.S. Cl.
CPC .......... *H05K 1/118* (2013.01); *H05K 2201/056* (2013.01); *H05K 2201/055* (2013.01); *H05K 2201/09236* (2013.01); *H01R 24/58* (2013.01); *H01R 2107/00* (2013.01); *H05K 1/147* (2013.01)
USPC ........................ 324/755.09; 343/895; 250/286

(58) Field of Classification Search
USPC .................................................... 324/755.09
See application file for complete search history.

(56) References Cited

U.S. PATENT DOCUMENTS

| 2,736,784 | A | | 2/1956 | Gore |
|---|---|---|---|---|
| 3,333,846 | A | | 8/1967 | Glass et al. |
| 3,806,801 | A | | 4/1974 | Bove |
| 3,825,874 | A | | 7/1974 | Peverill |
| D242,991 | S | | 1/1977 | McKenzie et al. |
| 4,688,878 | A | | 8/1987 | Cohen et al. |
| 4,802,092 | A | | 1/1989 | Harte |
| 4,802,869 | A | | 2/1989 | Maue |
| 5,207,005 | A | | 5/1993 | Amos et al. |
| 5,479,182 | A | * | 12/1995 | Sydor ............................ 343/895 |
| 5,994,695 | A | * | 11/1999 | Young ........................... 250/287 |
| 6,369,383 | B1 | * | 4/2002 | Cornish et al. ................ 250/286 |
| 7,110,762 | B1 | * | 9/2006 | Cameron et al. .............. 455/434 |
| 7,155,812 | B1 | * | 1/2007 | Peterson et al. .............. 29/610.1 |
| 7,253,787 | B2 | * | 8/2007 | Liu et al. ........................ 343/895 |
| 7,368,907 | B2 | | 5/2008 | Raulerson et al. |
| 7,411,563 | B2 | * | 8/2008 | Liu et al. ........................ 343/895 |
| 2002/0060289 | A1 | * | 5/2002 | Cornish et al. ................ 250/281 |
| 2004/0039497 | A1 | * | 2/2004 | Wood et al. ........................ 701/4 |
| 2007/0262915 | A1 | * | 11/2007 | Liu et al. ........................ 343/895 |
| 2009/0079531 | A1 | * | 3/2009 | Zach et al. ..................... 336/200 |
| 2009/0084975 | A1 | * | 4/2009 | Zach et al. ............. 250/396 ML |

* cited by examiner

*Primary Examiner* — Jermele M Hollington
*Assistant Examiner* — Christopher McAndrew
(74) *Attorney, Agent, or Firm* — Carlson, Gaskey & Olds, P.C.

(57) ABSTRACT

An electrical probe assembly includes a flexible circuit. A plurality of electrically conductive regions is on a first side of the flexible circuit. The flexible circuit is arranged about an axis formed by rolling the flexible circuit such that the electrically conductive regions form a plurality of isolated electrically conductive bands.

19 Claims, 5 Drawing Sheets

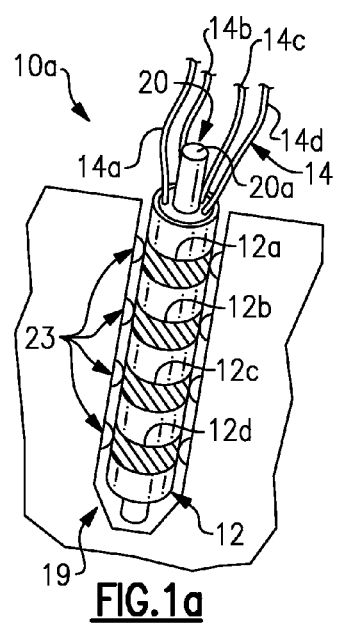 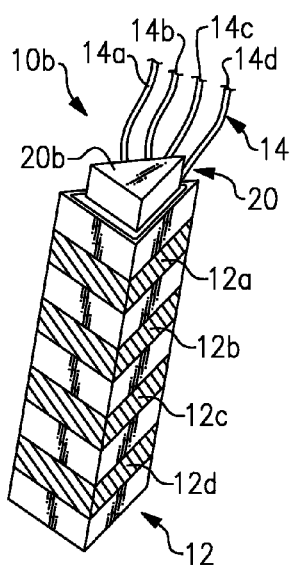 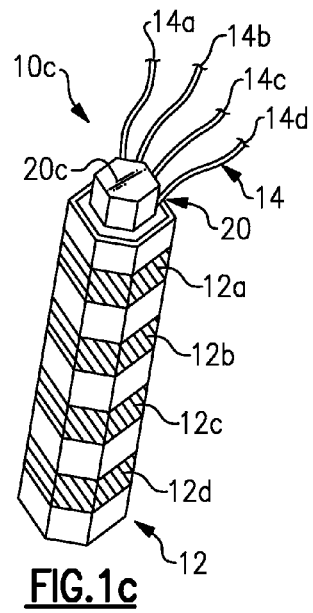
FIG.1a  FIG.1b  FIG.1c
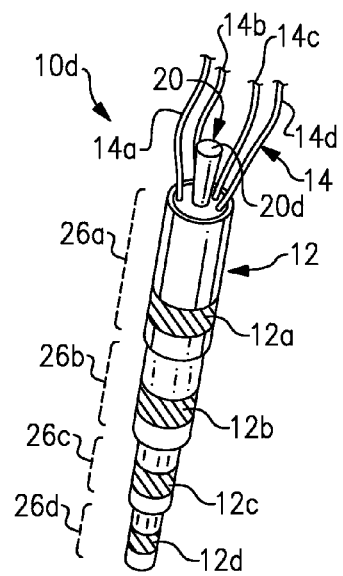 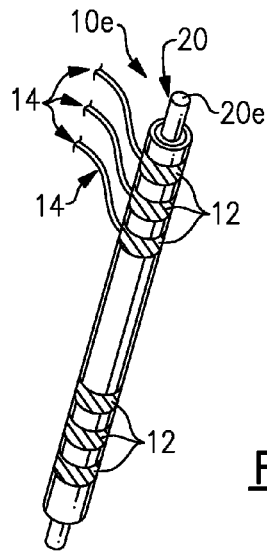 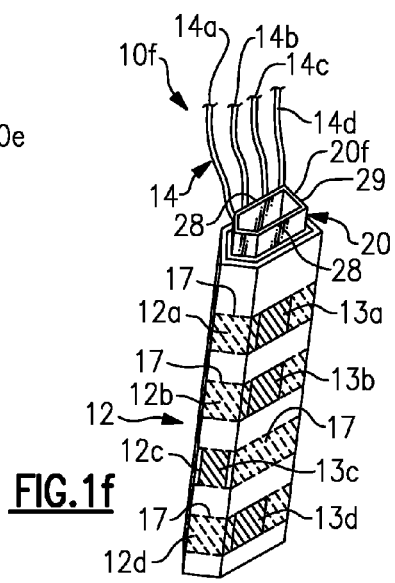
FIG.1d  FIG.1e  FIG.1f
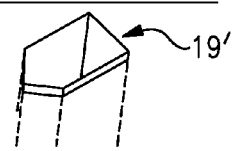

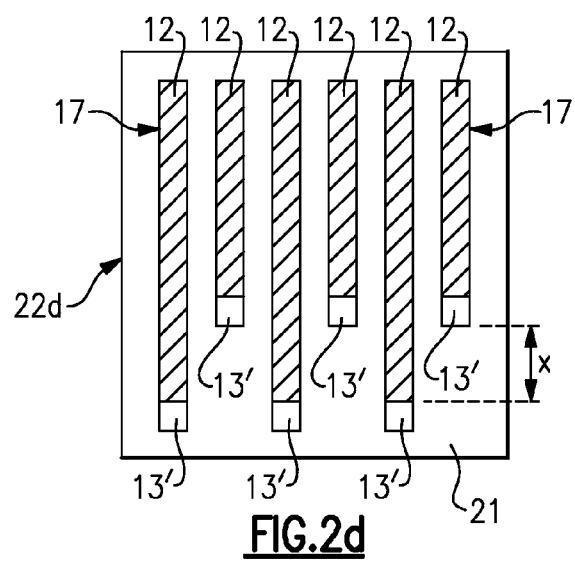
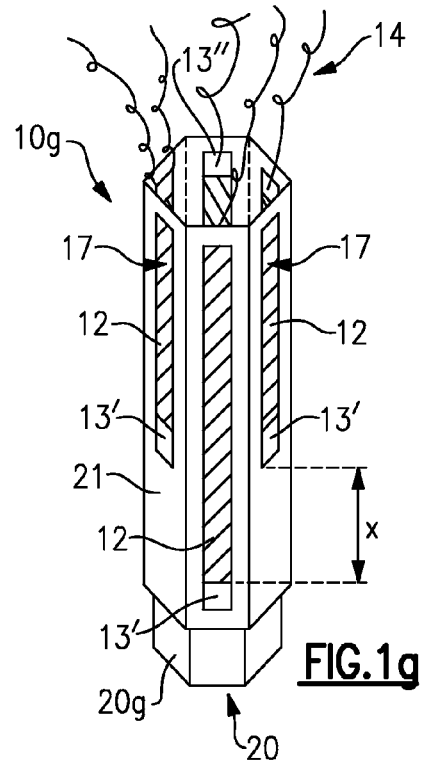
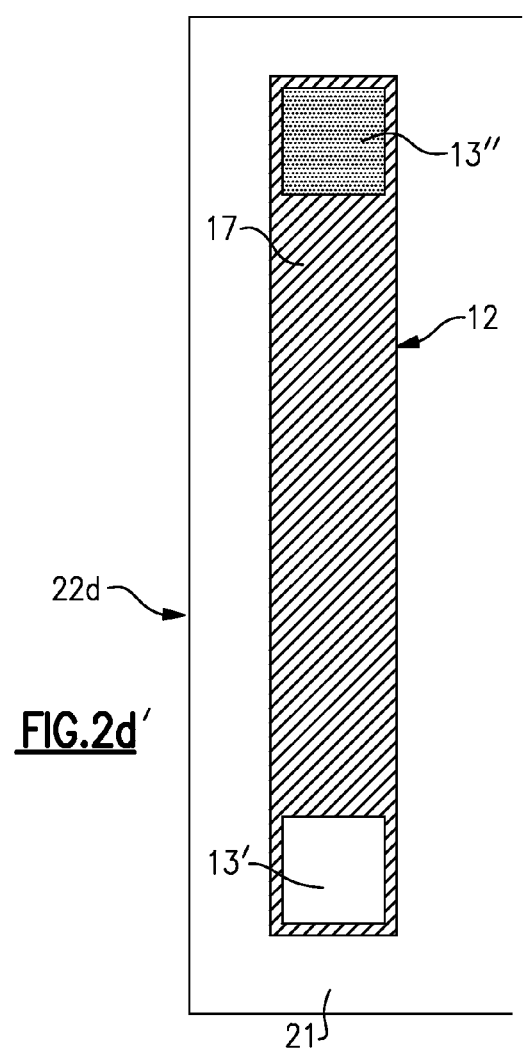

ELECTRICAL PROBE ASSEMBLY

RESEARCH OR DEVELOPMENT

This invention was in part produced through funding under a U.S. Government sponsored program (Contract No. N00019-02-C-3003) and the United States Government has certain rights therein.

BACKGROUND OF THE INVENTION

This application relates to electrical connectors, and more particularly to an electrical probe assembly.

An electrical probe may be used to form an electrical connection between two components. Various types of electrical probes are known. For example, probes can be used to facilitate data transmission (e.g. USB cable), or to facilitate sound transmission (e.g. headphone jack).

SUMMARY OF THE INVENTION

An example electrical probe assembly includes a flexible circuit. A plurality of electrically conductive regions is on a first side of the flexible circuit. The flexible circuit is arranged about an axis formed by rolling the flexible circuit such that the electrically conductive regions form a plurality of isolated electrically conductive bands.

In another aspect, an example electrical probe assembly includes an axial support member and a flexible circuit. A first layer of the flexible circuit is non-conductive. A second layer of the flexible circuit is conductive and covers portions of the first layer to form a plurality of electrically conductive regions. A third layer of the flexible circuit is non-conductive and covers portions of the portions of the electrically conductive regions to form a plurality of defined contact points. The flexible circuit is arranged around the axial support member to conceal an axially extending portion of each of the plurality of electrically conductive regions, and to expose the plurality of defined contact points around an outer periphery of the electrical probe assembly.

An example method of forming an electrical probe assembly includes forming a plurality of conductive regions on a first side of flexible circuit, coupling a lead wire to each of the plurality of conductive regions via an electrical connection, and arranging the flexible circuit around an axial support member to form a plurality of isolated electrically conductive bands, each electrically conductive band corresponding to a portion of one of the plurality of conductive regions.

These and other features of the present invention can be best understood from the following specification and drawings, the following of which is a brief description.

BRIEF DESCRIPTION OF THE DRAWINGS

FIG. 1a schematically illustrates a first example electrical probe assembly.

FIG. 1b schematically illustrates a second example electrical probe assembly.

FIG. 1c schematically illustrates a third example electrical probe assembly.

FIG. 1d schematically illustrates a fourth example electrical probe assembly.

FIG. 1e schematically illustrates a fifth example electrical probe assembly.

FIG. 1f schematically illustrates a sixth example electrical probe assembly.

FIG. 1g schematically illustrates a seventh example electrical probe assembly.

FIG. 2d schematically illustrates a flexible circuit configuration prior to being arranged around the axial support member of FIG. 1g.

FIG. 2d' schematically illustrates a close-up view of the configuration of FIG. 2d.

DETAILED DESCRIPTION OF THE PREFERRED EMBODIMENT

Figure 2A:
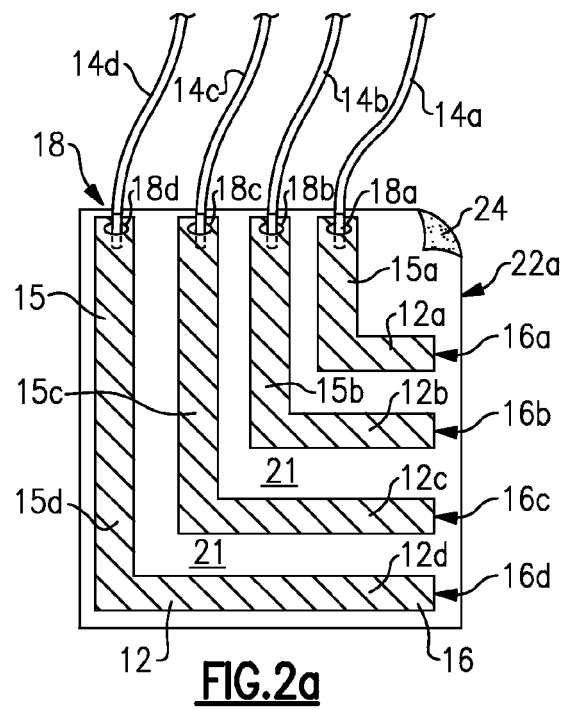
FIG. 2a schematically illustrates a flexible circuit configuration prior to being arranged around the axial support member of FIGS. 1a-c.

FIG. 1a illustrates an example electrical probe assembly 10a. For example, an aircraft engine may have an associated ice protection system that includes two separate heaters embedded within its structure, each requiring a power line in and a power line out. Thus, four six distinct electrical connections are required in a small area. The assembly 10a may be used to provide such a connection. However, as will be described below, the electrical probe assembly 10a has a broad range of other applications.

FIGS. 1a-g schematically illustrate exemplary electrical probe assemblies 10a-g. Each of the electrical probe assemblies 10a-g includes a plurality of conductive bands 12. Each conductive band 12 extends around an outer periphery of its associated electrical probe assembly 10, and is electrically connected to a lead wire 14. Using the electrical probe assembly 10a as an example, conductive band 12a is connected to lead wire 14a, conductive band 12b is connected to lead wire 14b, conductive band 12c is connected to lead wire 14c, and conductive band 12d is connected to lead wire 14d. The electrical probe assemblies 10b-f are likewise arranged. The electrical probe assembly 10a may be received into an opening 19, which includes electrical contacts 23. Likewise, the electrical probe assemblies 10b-e of FIG. 1b-e may be configured in a similar environment as FIG. 1a.

Each electrical probe assembly 10a-g includes an axial support member 20 that extends along the respective interior. In one example the support member 20 is a dowel that may be made of rubber, metal, or another suitable material. Of course, other axial support members could be used. In the assemblies 10a and 10d-e the axial support members 20a, 20d-e are cylindrically shaped and include a circular cross-section. In the assembly 10b, the axial support member 10b has a triangular cross-section. In the assemblies 10c, 10f and 10g, the axial support members 20c, 20f and 20g have a polygonal cross section. However, axial support members 20 having other cross-section shapes could be used.

In the assembly 10f, the shape of the support member 20f is keyed such that the electrical probe assembly 10f must be inserted into a corresponding opening 19' in a predetermined orientation for a "mistake proof" installation into. If the electrical probe assembly 10f was rotated 90° about the axial support member 20f, for example, it would not fit in the opening 19'. Thus, the electrical probe assembly 10f aligns with the opening 19', and the probe assembly 10f and the opening 19' can mate in only one orientation but not in others. As an example, the axial support member 20f may be designed to have linear sides with one side 28 being longer than another side 29. Of course, other shapes could be used to achieve the same function.

Also, in the assembly 10f, portions 17 of each of the conductive bands 12a-d are concealed with a non-conductive layer to expose defined conductive regions 13a-d which act as defined contact points. Similarly, in the assembly 10g, portions 17 of each of the conductive bands 12 are concealed with a non-conductive layer to expose defined conductive regions 13' which act as defined contact points. However, in the assembly 10g the defined conductive regions 13' are spaced axially by a distance "x" along the axial support member 20g.

FIGS. 2a-d schematically illustrate a plurality of configurations for flexible circuit 22 that may be arranged around (e.g., wrapped around) one of the axial support members 22a-f to form one of the electrical probe assemblies 10a-f. FIG. 2a schematically illustrates a non-conductive flexible circuit 22a having a generally rectangular shape. The flexible circuit 22 includes a non-conductive region 21 and a plurality of conductive regions 16a-d. Each of the plurality of conductive bands 12a-d corresponds to one of the conductive regions 16a-d. The plurality of conductive regions 16 are formed on a first side of the non-conductive flexible circuit 22a. In one example the flexible circuit 22a is a two-ply polyimide film (e.g., KAPTON®). In one example the conductive regions 16 are formed by laser etching material from the surface of the first side of the flexible circuit 22 to leave the conductive regions 16 in the desired shape and position. In another example the conductive regions 16 are formed by a photoelectric process.

An adhesive 24 is applied to a second side of the flexible circuit 22a to bond the flexible circuit 22a to the axial support member 20a (see, e.g. FIG. 1a). Also, as described above, a non-conductive layer (see portions 17) may be formed on top of the conductive regions 12c to conceal portions of the conductive bands 12a-d, exposing conductive regions 13a-d, each having a rectangular shape, which can act as defined contact points (see FIG. 1f). Of course, other conductive region 13 shapes would be possible.

Each of the conductive regions 16 includes a conductive band portion 12 and a portion 15. The portion 15 extends in a first direction, axially along the support member (see FIG. 3) and may be concealed when the flexible circuit 22 is arranged around the support member 20. Each conductive band portion 12 extends in a second direction that is transverse to the first direction. Although the second direction is illustrated as being perpendicular to the first direction in FIG. 2a, it is understood that other configurations are contemplated (see, e.g., FIG. 6). Each of the conductive regions 16a-d is electrically connected to a corresponding lead wire 14a-d via a connection 18. In one example the connections 18 are soldered connections. In other examples, the connections 18 may be crimped connections, laser welded connections, or other suitable electrical connections.

Figure 3:
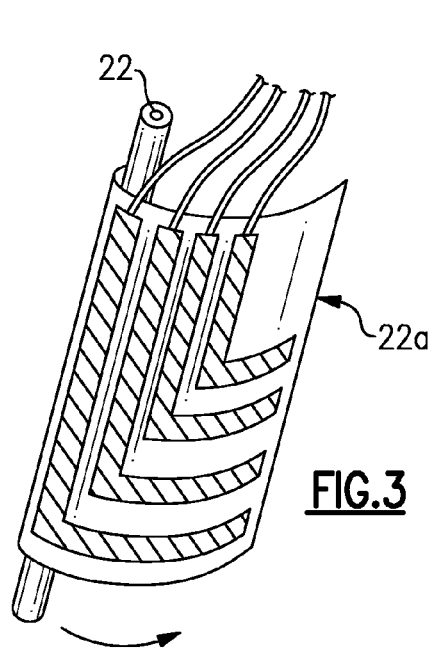
FIG. 3 schematically illustrates an electrical probe assembly winding configuration.

As shown in FIG. 3, the flexible circuit 22 is wrapped around support member 20 to form the electrical probe assembly 10. As the film 22 is wrapped around the support member, the film 22 covers the conductive area portions 15, such that the only exposed conductive area is the conductive bands 12.

Figure 2B:
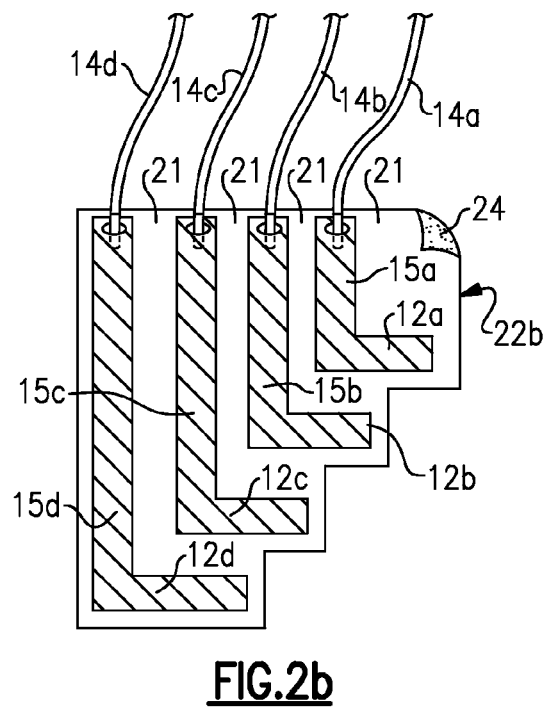
FIG. 2b schematically illustrates a flexible circuit configuration prior to being arranged around the axial support member of FIG. 1d.

FIG. 2b schematically illustrates a second flexible circuit 22b having a different configuration from that of film 22a. The film 22b includes conductive band portions 12a-d of uniform length such that when the film 22b is wrapped around support member 20, each conductive band 12a-d is formed within a band region 26a-d (see FIG. 1d), with each band region 26a-d having a progressively smaller diameter. Referring to FIG. 1d, region 26a has a first diameter, region 26b has a second diameter that is progressively smaller than the first diameter, region 26c has a third diameter that is progressively smaller than the second diameter, and region 26d has a fourth diameter that is progressively smaller than the third diameter.

Figure 2C:
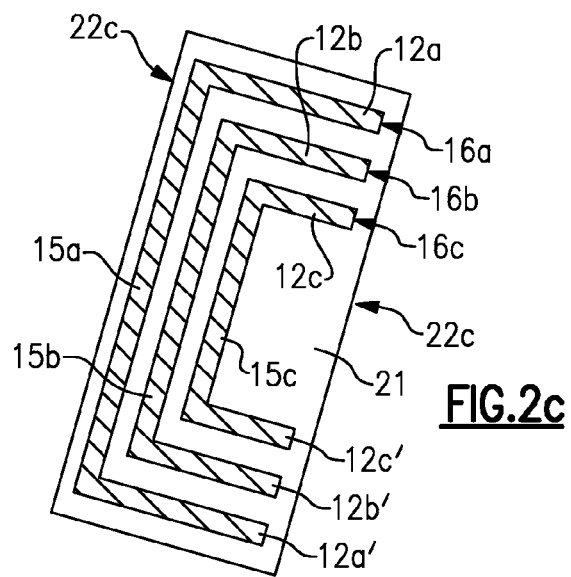
FIG. 2c schematically illustrates a flexible circuit configuration prior to being arranged around the axial support member of FIG. 1e.

FIG. 2c schematically illustrates another configuration of a flexible circuit 22c, which may be used to form the electrical probe assembly 10e. As shown in FIG. 2c, a plurality of portions 15 extending in the first direction along axially along the support member 20 (see FIG. 1e), a first set of conductive band portions 12a-c, extending in a second direction that is transverse to the first direction, and a third set of conductive band portions 12'a-c extending in a third direction that is parallel to the second direction, such that each conductive region 16 forms two conductive bands (12, 12').

FIG. 2d schematically illustrates another configuration of a flexible circuit 22d, which may be used to form the electrical probe assembly 10g. As shown in FIG. 2d, a plurality of conductive bands 12 extend axially along the support member 20g (see FIG. 1g). Portions 17 of the conductive bands 12 are concealed with a non-conductive layer to expose defined conductive regions 13' which act as defined contact points that are spaced axially along the support member 20g by a distance "x." Thus, a distance between contact points is increased while minimizing a size of the assembly 10g.

FIG. 2d' illustrates a close-up view of the configuration of FIG. 2d. As shown in FIG. 2d', the flexible circuit 22d includes a conductive band 12. Portions 17 of the conductive band 12 are concealed with non-conductive layer to define a conductive region 13' on a first side of the flexible circuit 22d, and a conductive region 13" on a second side of the flexible circuit 22d. Once arranged around axial support member 20g, lead wires may be applied to the conductive regions 13" so that the conductive regions 13' are exposed on an exterior of the electrical probe assembly 10g.

Figure 4:
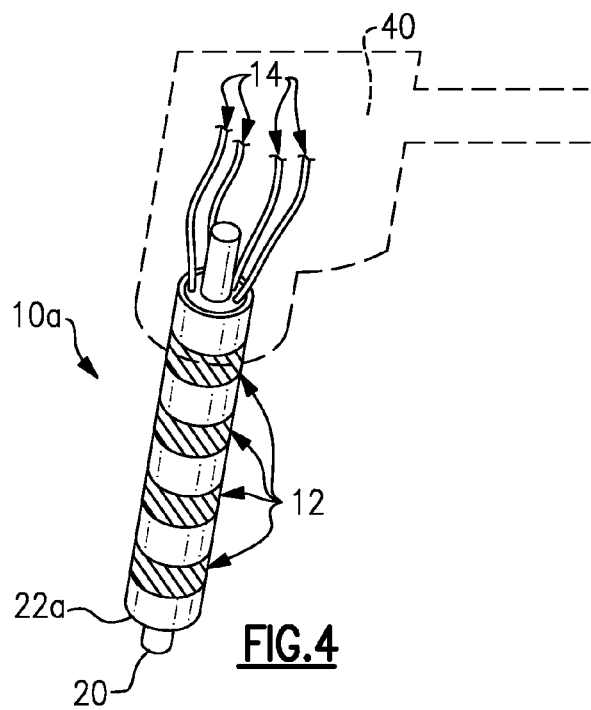
FIG. 4 schematically illustrates the electrical probe assembly of FIG. 1a including an overmold.

In a subsequent stage of manufacture, an overmold 40 may be used to provide retention and handling features for the electrical probe assembly 10. FIG. 4 schematically illustrates the electrical probe assembly 10a of FIG. 1 including an overmold 40 that provides a covering for the lead wires 14 and a portion of the flexible circuit 22a. The overmold 40 provides a mechanical retention function to retain the lead wires 14, the flexible circuit 22a, and a portion of the axial support member 20a. The overmold 40 also may provide a handling feature such that one could grip the overmold 40 to insert and remove the probe assembly 10 into an opening (e.g. opening 19 of FIG. 1), while avoiding applying stress to the connections 18 that could result from tugging on the lead wires 14. In one example the overmold 40 is formed of polytetrafluoroethylene ("PTFE") or a material that includes PTFE. Of course, other materials could be used to form the overmold 40.

Figure 5:
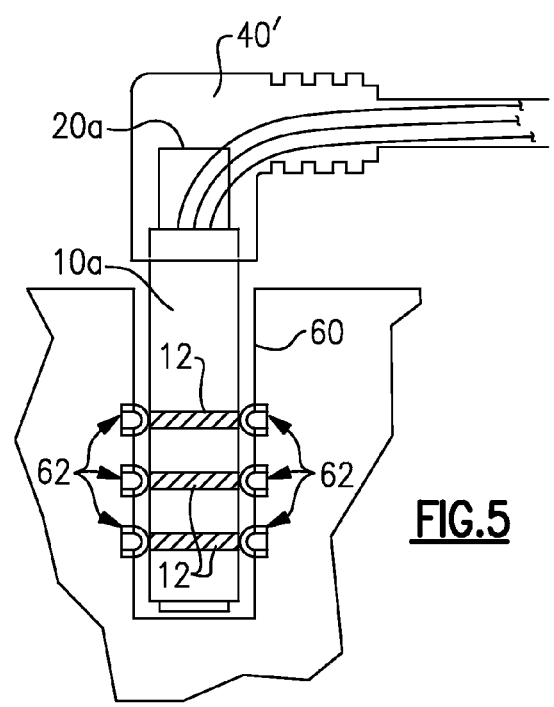
FIG. 5 schematically illustrates an opening for receiving an electrical probe assembly.

FIG. 5 schematically illustrates an opening 60 for an electrical probe assembly 10. The electrical probe assembly 10, which includes an overmold 40', is received into the opening 60. A plurality of spring contacts 62 contact and form an electrical connection with the conductive bands 12, and may be used to form a friction fit to retain the electrical probe assembly 10 in the opening 60. Of course, other contact designs could be used to form the electrical connection 62. In one example the lead wires 14 correspond to a wiring harness, and the opening 60 corresponds to an opening in an aircraft engine sensor The engine sensor could be used to detect temperature, pressure, or vibration, for example. The opening could also correspond to an opening in an aircraft engine actuator. The configuration of the electrical probe assembly 10 could be used to realize a reduction in space occupied by prior art electrical connections in an aircraft, and could therefore provide a corresponding weight decrease and efficiency increase.

In a modified example, the overmold 40' retains two electrical probe assemblies 10. This dual configuration could be useful, for example, in a 7.1 channel surround sound configuration that requires 7 separate speaker connections. The dual probe configuration could include 4 connections on a first probe and 3 connections on a second probe.

Figure 6:
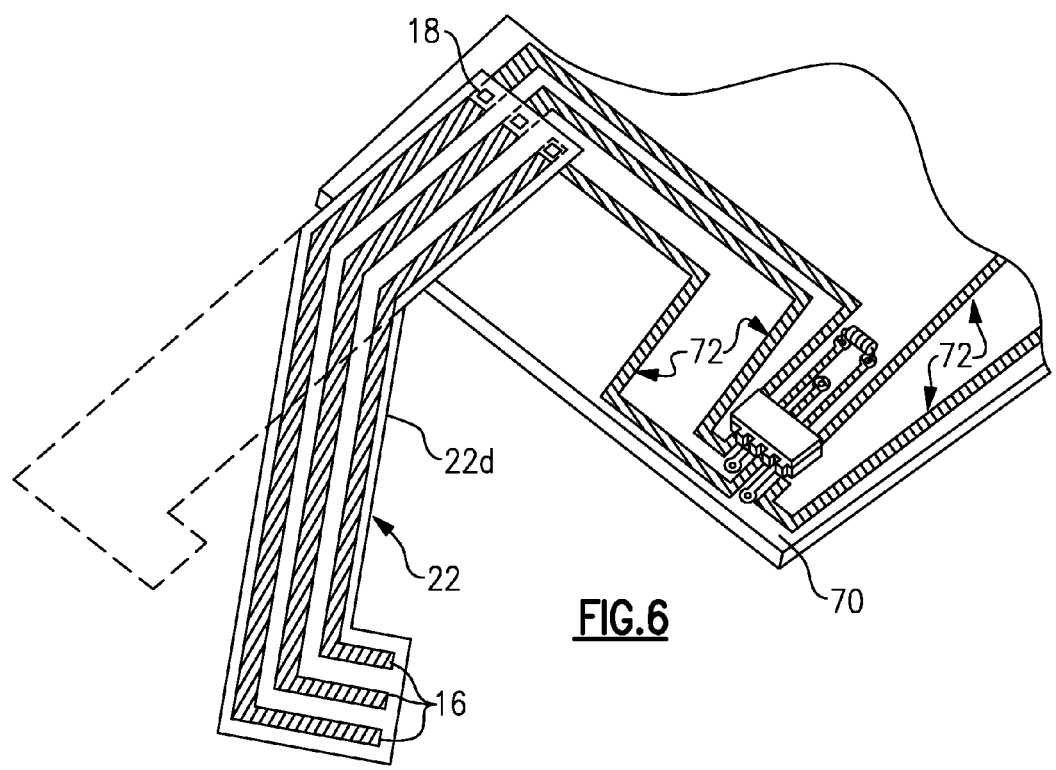
FIG. 6 schematically illustrates a printed circuit board configuration incorporating an electrical probe assembly.
Figure 6:
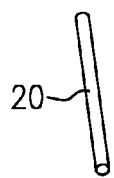
Figure 6A:
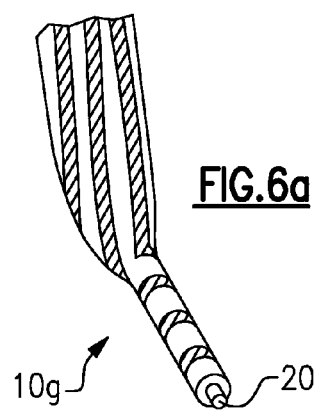
FIG. 6a schematically illustrates the electrical probe assembly of FIG. 6.

The electrical probe assembly 10 has many potential applications, such as aviation electronics, commercial electronics, etc., but is not limited to any particular use. Printed circuit boards, for example, are used in many electronics applications, including computers. FIGS. 6, 6a schematically illustrate an example printed circuit board configuration involving an electrical probe assembly 10g. A circuit board 70 includes a plurality of conductive portions 72. A flexible circuit 22 also includes conductive portions 16 which may be connected to the conductive portions 72 via connections 18. As shown in FIG. 6a, a portion of the flexible circuit may be wrapped around support member 20 to form electric probe assembly 10g.

Although embodiments of this invention have been disclosed, a worker of ordinary skill in this art would recognize that certain modifications would come within the scope of this invention. For that reason, the following claims should be studied to determine the true scope and content of this invention.

What is claimed is:

1. An electrical probe assembly comprising:
   a flexible circuit including a plurality of electrically conductive regions on a first side of the flexible circuit;
   wherein the flexible circuit is arranged about an axis formed by rolling the flexible circuit such that the first side and the electrically conductive regions face radially outwards and form a plurality of isolated electrically conductive bands, at least partially exposed, around an outer periphery of the rolled flexible circuit,
   a support member around which the rolled flexible circuit extends such that the support member extends along the axis; and
   an adhesive between a second, opposite/interior side of the rolled flexible circuit and an outer surface of the axial support member, the adhesive bonding the flexible circuit and the support member together.

2. The assembly of claim 1, wherein each of the plurality of electrically conductive bands extends around an outer periphery of the electrical probe assembly, each electrically conductive band being axially spaced at a different distance from an end of the axial support member.

3. The assembly of claim 1, further comprising:
   a plurality of lead wires each electrically connected with one of the plurality of electrically conductive regions, the plurality of lead wires corresponding to a wiring harness, the assembly being received into an opening to electrically connect the wiring harness to an aircraft engine sensor.

4. The assembly of claim 3, further comprising:
   a non-conductive overmold embedding at least a portion of the plurality of lead wires and the axial support member.

5. The assembly of claim 1, wherein each of the plurality of conductive regions includes a first portion and a second portion, the first portion extending in a first direction axially along the axial support member and being concealed by the flexible circuit upon being arranged around the axial support member, and the second portion extending in a second direction that is transverse to the first direction, each of the second portions forming one of the plurality of conductive bands.

6. The assembly of claim 5, wherein each of the plurality of conductive regions further includes a third portion extending in a third direction that is parallel to the first direction, and wherein each of the third portions forms one of the plurality of conductive bands.

7. The assembly of claim 1, wherein a cross-sectional shape of the axial support member is at least one of a circle, and a triangle, or a polygon.

8. The assembly of claim 1, wherein first portions of the plurality of electrically conductive bands are concealed such that second portions of the plurality of electrically conductive bands are defined contact points.

9. The assembly of claim 8, wherein the electrically conductive bands extend axially along the support member, and have alternating lengths such that each defined contact point is spaced axially by a predefined distance from an adjacent defined contact point.

10. The assembly of claim 1, wherein the electrical probe assembly is receivable within an opening that includes spring-loaded contacts that electrically connect to the plurality of electrically conductive bands.

11. The assembly of claim 1, wherein the electrical probe assembly is keyed to mate with a corresponding opening in one, exclusive configuration.

12. The assembly of claim 1, wherein each of the plurality of isolated electrically conductive bands corresponds to a band region, each band region having a progressively smaller diameter.

13. The assembly of claim 1, wherein each of the electrically conductive regions is electrically connected to a printed circuit board.

14. The assembly of claim 1, further comprising a plurality of lead wires electrically connected to corresponding ones of the plurality of electrically conductive regions, the plurality of lead wires extending through an axial face of the rolled flexible circuit.

15. The assembly of claim 1, wherein the rolled flexible circuit has a multi-faced polygonal cross-section.

16. The assembly of claim 1, wherein portions of the isolated electrically conductive bands around the outer periphery of the rolled flexible circuit are covered with a non-conductive layer such that other portions of the isolated electrically conductive bands around the outer periphery of the rolled flexible circuit are exposed.

17. The assembly of claim 16, wherein the exposed portions of the isolated electrically conductive bands around the outer periphery of the rolled flexible circuit face toward different directions.

18. The assembly of claim 1, wherein the rolled flexible circuit includes circumferential steps such that the rolled flexible circuit sequentially decreases in diameter from one axial end of the rolled flexible circuit to an opposed axial end, with the plurality of isolated electrically conductive bands being at different diameters.

19. The assembly of claim 1, wherein the isolated electrically conductive bands are fully exposed around the outer periphery of the rolled flexible circuit.

* * * * *